United States Patent [19]
Petr

[11] 4,124,821
[45] Nov. 7, 1978

[54] ANALOG TO FREQUENCY CONVERTOR

[75] Inventor: Jan Petr, Zug, Switzerland

[73] Assignee: LGZ Landis & Gyr Zug AG, Zug, Switzerland

[21] Appl. No.: 824,736

[22] Filed: Aug. 15, 1977

[30] Foreign Application Priority Data

Aug. 25, 1976 [CH] Switzerland .................... 10804/76

[51] Int. Cl.$^2$ ........................................... H03K 13/02
[52] U.S. Cl. ................................... 328/151; 307/261; 307/271; 307/362; 328/128
[58] Field of Search ............... 307/261, 262, 271, 350, 307/362; 328/127, 128, 151, 150; 340/347 AD

[56] References Cited
U.S. PATENT DOCUMENTS

| 3,256,426 | 6/1966 | Roth et al. | 328/127 X |
| 3,541,320 | 11/1970 | Beall | 328/127 X |
| 3,639,843 | 2/1972 | Schmidhauser | 328/127 X |
| 3,989,961 | 11/1976 | Masreliez | 328/127 X |

Primary Examiner—John Zazworsky
Attorney, Agent, or Firm—Morgan, Finnegan, Pine, Foley & Lee

[57] ABSTRACT

An analog to frequency convertor for developing an output signal of frequency proportional to a measuring current or voltage by the charge quantity compensation method, comprising an integrator, a threshold switch downstream thereof, a compensating charge transmitter which supplies a constant compensating charge to a capacitor of the integrator each time the threshold switch responds, and a control circuit to generate a periodic digital polarity signal which controls the polarity of the measuring current or voltage and of the compensating charge transmitter and always changes its logic value at the same level of the output voltage of the integrator.

12 Claims, 5 Drawing Figures

ANALOG TO FREQUENCY CONVERTOR

BACKGROUND OF THE INVENTION

1. Field of the Invention

This invention relates to an analog to frequency convertor.

2. Description of the Prior Art

Analog to frequency convertors are known in many different forms. Where there are high accuracy requirements, for example in static electricity meters, the charge quantity compensation process and the charge changing process are now preferred to other methods.

In the charge quantity compensation process, known for example from Landis & Gyr News 19 (1972) 1 page 13, a measuring current is integrated in an integrator, and each time a given integrator voltage is reached a constant compensation charge is withdrawn from the integrator. A balance is established between the charge supplied and the charge withdrawn, the number of compensating charges per unit of time being proportional to the measuring current. The charge content of the individual compensation pulses represents a measuring constant and can be kept constant very accurately with simple means. On the other hand, special measures have to be taken to prevent the analog to frequency convertor from running idle.

In the charge changing process, known for example from German Offenlegungsschrift No. 1,946,245, the measuring current is similarly integrated in an integrator; each time a certain upper threshold value and a certain lower threshold value of the integrator voltage is reached, the polarity of the measuring current is reversed, thereby reversing the direction of integration. The number of polarity changes per unit of time is proportional to the measuring current. In the charge changing process the value of the integrator capacitance and the difference between the upper and lower threshold value represent measuring constants which are difficult to keep constant with the requisite long term stability. On the other hand idle running of the analog to frequency convertor is prevented automatically. Where such an analog to frequency convertor is used in a static electricity meter, fault currents independent of the reversal of polarity can be partly compensated by the periodic reversal of polarity, thereby extending the measuring range.

SUMMARY OF THE INVENTION

Accordingly, it is an object of this invention to provide an analog to frequency convertor which combines the advantages of the charge compensation process and those of the charge changing process.

Another object of this invention is to provide an analog to frequency convertor having a measuring constant determined by the charge content of compensating pulses.

A further object of this invention is to provide an analog to frequency convertor wherein fault currents are compensated and idle running automatically prevented.

According to the present invention there is provided an analog to frequency convertor for developing an output signal of frequency proportional to a measuring current or voltage by the charge quantity compensation method, comprising an integrator, a threshold switch, a compensating charge transmitter and a control circuit to generate a periodic digital polarity signal which controls the polarity of the measuring current or voltage and of the compensating charge transmitter and always changes its logic value at the same level of the output voltage of the integrator.

The above, and other objects, features and advantages of this invention, will be apparent in the following detailed description of illustrative embodiments which is to be read in connection with the accompanying drawings.

DESCRIPTION OF THE PREFERRED EMBODIMENTS

Figure 1:
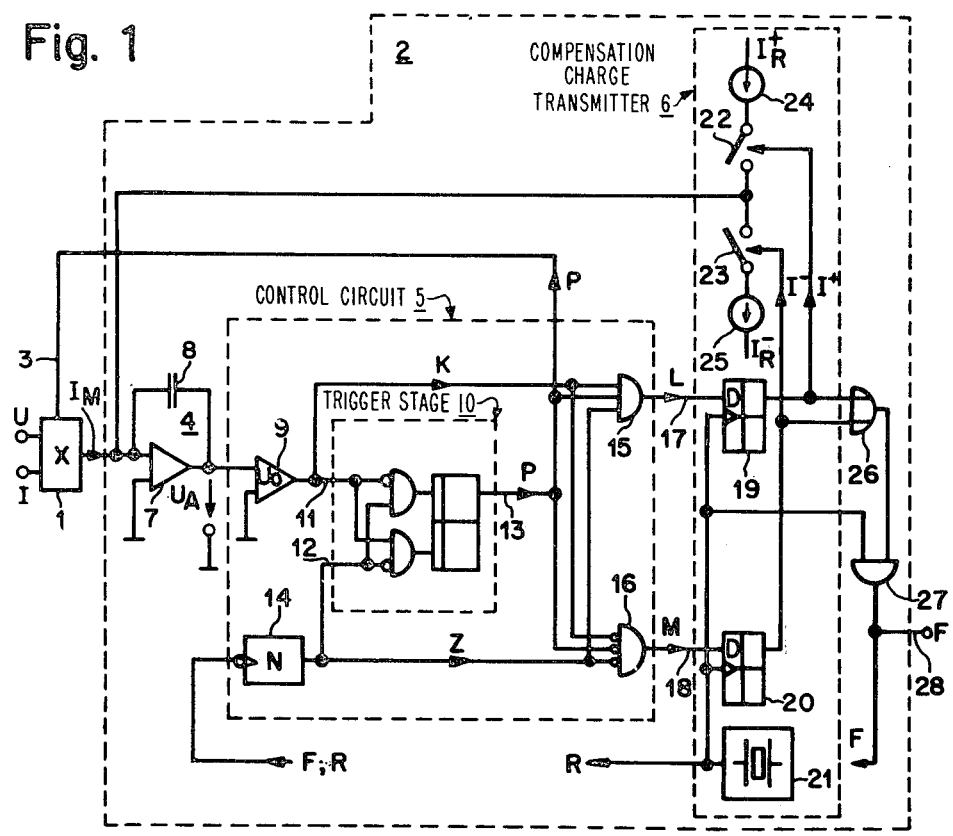
FIG. 1 is a schematic circuit diagram of a static electricity meter with an analog to frequency convertor.

Referring to FIG. 1, 1 represents a multiplier which transmits a measuring current $I_M$ to the input of an analog to frequency convertor 2. The measuring current $I_M$ is proportional to the product of a voltage U and a current I. The multiplier 1 has a control input 3 to which a digital polarity signal P is applied. With this polarity signal P the sign of the multiplication and thus the polarity of measuring current $I_M$ can be reversed. The polarity can be reversed in known manner, for example, by reversing the polarity of the voltage U or the current I, or by a digital signal inversion in the multiplier 1.

The analog to frequency convertor 2 comprises an integrator 4, a control circuit 5 and a compensation charge transmitter 6. In the illustrated embodiment, the integrator 4 is made up of an amplifier 7 and a capacitor 8 included in the feed-back circuit thereof.

The output of the integrator 4 is connected to a threshold switch 9, which is used in known manner to initiate the charge compensating pulses and is also a component of the control circuit 5 generating the polarity signal P. In the FIG. 1 example, the threshold switch 9 is a voltage comparator with one threshold voltage $U_0$.

The control circuit 5 further comprises a trigger stage 10 with two inputs 11 and 12 and an output 13. The trigger stage 10 may be made up of an RS flip-flop and two interconnected input gates, and the truth table for it is given below:

| K | Z | P |
|---|---|---|
| 0 | 0 | X |
| 0 | 1 | 1 |
| 1 | 0 | 0 |
| 1 | 1 | X |

K being the signal at the input 11, Z the signal at the input 12, P the polarity signal at the output 13, and X the previous state. The input 11 of the trigger stage 10 is connected to the output of the threshold switch 9, and the input 12 is connected to the output of a divider stage 14. The division ratio N of the divider stage 14 is linear and equal to at least 2.

Two signals L and M are formed from the signals K, Z and P by two AND-gates 15 and 16. For this purpose the two inputs 11 and 12 and output 13 of trigger stage 10 are coupled to three inputs of the AND-gate 15 and to three inverting inputs of the AND-gate 16. The AND-gate 15 is connected to a tripping input 17 for positive charge pulses of the compensating charge transmitter 6, and the AND-gate 16 is connected to a tripping input 18 for negative charge pulses.

The tripping inputs 17 and 18 of the compensating charge transmitter 6 are respectively connected to the D-input of a D flip-flop 19 or 20, the clock inputs of which are connected to a time base oscillator 21 which is preferably quartz-stabilized. Signals $I^+$ and $I^-$ appear at the outputs of the flip-flops 19 and 20 respectively, and switch respective constant current sources 24 and 25 by means of switches 22 and 23 respectively. The constant current source 25 supplies a negative reference current $I_R^-$ to the input of the integrator 4.

The outputs of the flip-flops 19 and 20 are further coupled to an OR-gate 26. An AND-gate 27 has two inputs respectively connected to the outputs of the time base oscillator 21 and the OR-gate 26. The AND-gate 27 supplies an output signal F to an output 28 of the analog to frequency convertor 2.

As indicated in FIG. 1, the output 28 carrying the output signal F may be connected to the input of the divider stage 14. It is further possible for the divider stage 14 to be controlled by the reference signal R of the time base oscillator 21 or by a different constant frequency. Finally, the divider stage 14 may be omitted and the signal Z fed into the control circuit 5 from outside at a suitably selected constant frequency.

Figure 2:
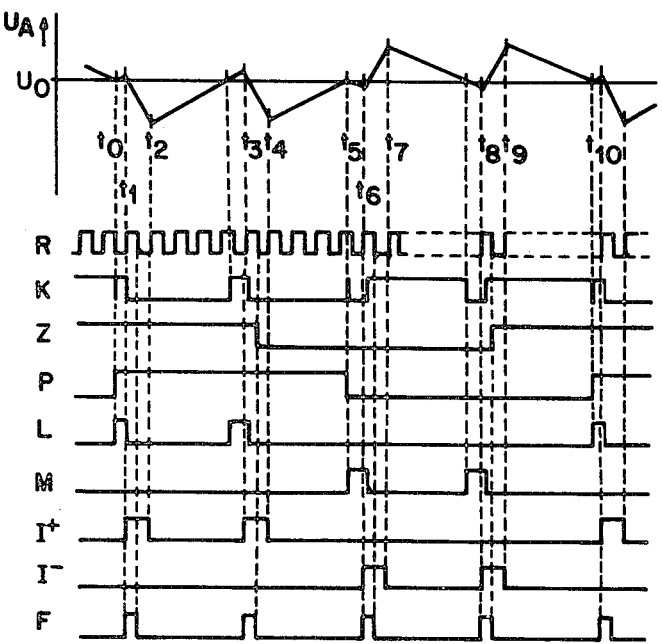
FIG. 2 is a pulse diagram of the analog to frequency convertor of FIG. 1.

Referring now to FIG. 2, the operation of the analog to frequency convertor described will now be explained, in the case where the output signal F is fed into the divider stage 14 and N is 4. FIG. 2 shows the timing of the output voltage $U_A$ of the integrator 4 and of the digital signals R, K, Z, P, L, M, $I^+$, $I^-$ and F with a constant measuring current $I_M$.

The period of the polarity signal P gives a switching-over cycle beginning at time $t_0$ and ending at time $t_{10}$. In the first half period $t_0$ to $t_5$ measuring current $I_M$ is negative, and in the second half period $t_5$ to $t_{10}$ it is positive. After the change of polarity produced by the polarity signal P at time $t_0$, the output voltage $U_A$ initially rises briefly, due to negative measuring current $I_M$, so that the signals K and L have the logic value 1, until at time $t_1$ the next rising edge of the reference signal R trips the flip-flop 19, the switch 22 closes and the positive constant current source 24 is switched on. From this time $t_1$ onwards the output voltage $U_A$ drops owing to the dominance of the positive reference current $I_R^+$ relative to the negative measuring current $I_M$; when it drops below the threshold value $U_0$ the signals K and L become logic 0, which initially has no further effect. At time $t_2$ the flip-flop 19 is tripped into the inoperative condition by the next rising edge of the reference signal R, causing the constant current source 24 to be switched off again. The switching on and off of the constant current source 24 (signal $I^+$) is repeated again at the times $t_3$ an $t_4$.

During the operative sequence so far described, the two output pulses (the output signal F) are transmitted to output 28 and to the divider stage 14 (and each time the pulses of the signals R and $I^+$ overlap). When the second output pulse disappears, the signal Z at the output of the divider stage 14 becomes logic 0. As a result, the next time the threshold voltage $U_0$ is exceeded, at time $t_5$, the trigger circuit 10 trips immediately, the polarity signal P becomes logic 0 and the polarity of the measuring current $I_M$ is subsequently reversed; that is, the measuring current $I_M$ becomes positive. During the second half period of the polarity signal P the sequence described is repeated with positive measuring current $I_M$ and negative reference current $I_R^-$.

It can easily be seen from FIG. 2 that the polarity signal P, which controls the polarity of the measuring current $I_M$ and the reference current $I_R^+$ and $I_R^-$ of the compensating charge transmitter 6, always changes its logic value at the same level $U_0$ of output voltage $U_A$, so that the balance sheet of the charge flowing in due to the measuring current $I_M$ and flowing out due to the reference current $I_R$ is perfectly correct after each half period of the polarity signal P. This ensures that no incorrect measurements due to large losses can be caused by the periodic reversal of polarity.

The reversal of polarity automatically prevents idle running. If the measuring current $I_M$ drops below the value of a fault current, independent of polarity, flowing to the integrator 4, the integrator 4 will be driven into saturation after the next change of polarity at the latest.

The periodic change of polarity to a great extent compensates for the effect which a fault current superimposed on measuring current $I_M$ has on the output frequency of the analog to frequency convertor 2. There is no full compensation where the reversal of polarity is controlled by the output frequency, because the half periods of the polarity signal P are made unequally long by the fault current. The relative measuring error $F_{rel}$ is then:

$$F_{rel} = (I_F/I_M)^2$$

$I_F$ being the fault current.

The effect which the fault current, independent of polarity, has on output frequency can be compensated for fully if the reversal of polarity is derived from a constant frequency source synchronized with the output frequency of the analog to frequency convertor 2. The frequency of the polarity reversal must then be lower than the minimum output frequency occurring. Synchronization causes the half period of the polarity reversal to undergo statistical scattering equal to the period duration of the output frequency. Over a sufficiently long measuring period, however, the mean value of the two half periods of polarity reversal becomes the same, so that the effect of the fault current is fully compensated.

This type of operation is obtained when the constant frequency of a reference oscillator is fed into the divider stage 14. A pulse diagram of this alternative arrangement would differ from that of FIG. 2, only in that the signal Z would be fully independent of the output signal F, and in that the number of output pulses per half period of the polarity signal P would not always have to be the same.

The polarity signal P may be used as the output signal of the analog to frequency convertor 2 instead of the output signal F. The frequency of the polarity signal P, unlike that of the output signal F, is not subject to any temporary fluctuations due to synchronization with the reference signal R, but nevertheless has a fixed relationship with the scattering frequency of the output signal F.

Figure 3:
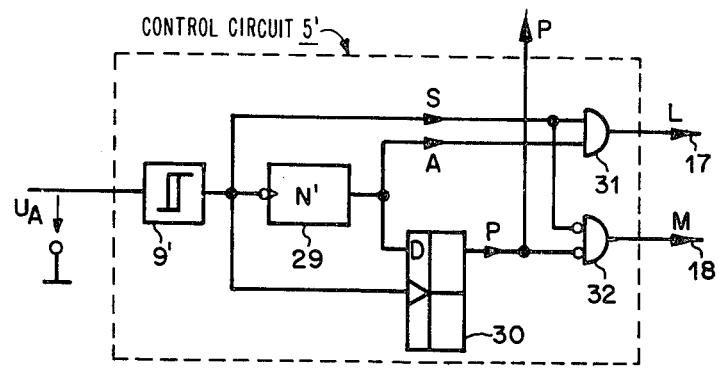
FIG. 3 is a schematic circuit diagram of a modified form of a control circuit for the analog to frequency convertor of FIG. 1.

FIG. 3 shows a control circuit 5' which may be used in the FIG. 1 arrangement instead of the control circuit 5. In the control circuit 5', a Schmitt trigger circuit with an upper and lower threshold value is provided as the threshold switch 9'. The control circuit 5' further contains a divider stage 29, the division ratio of which is N', a D flip-flop 30 and two AND-gates 31 and 32. The output of the threshold switch 9' is connected to the input of the divider stage 29 and to the clock input of the flip-flop 30, the D-input of which is coupled to the output of the divider stage 29. The signal at the output of the threshold switch 9' is again defined as S. A signal A appears at the output of the divider stage 29 and the polarity signal P at the output of flip-flop 30. The divider stage 29 responds to falling edges of the signal S and flip-flop 30 to rising edges of the signal S.

The output of the threshold switch 9' is also connected to an input of the AND-gate 31 and to an inverting input of the AND-gate 32. The output of the divider stage 29 is coupled to a further input of the AND-gate 31, and the output of the flip-flop 30 to a further inverting input of the AND-gate 32. The signals L and M appear at the outputs of the two AND-gates 31 and 32, which are connected to tripping inputs 17 and 18 of the compensating charge transmitter 6 (FIG. 1).

Figure 4:
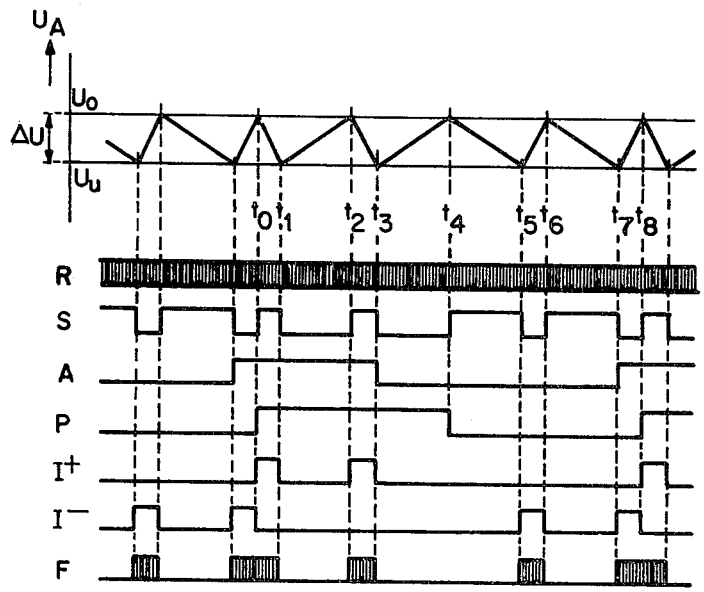
FIG. 4 is a pulse diagram for explaining the operation of the analog to frequency convertor of FIG. 1 with the control circuit of FIG. 3.

FIG. 4 is the associated pulse diagram for the case where N' is 4. The hysteresis, that is the difference between the upper threshold value $U_0$ and the lower threshold value $U_U$ of the threshold switch 9', is defined as $\Delta U$. Polarity reversal always takes place at the exact time when the output voltage $U_A$ of integrator 7 reaches upper threshold value $U_0$. When the threshold value $U_0$ or $U_U$ is reached, the constant current source 24 or 25 is further switched on, and the output voltage of the integrator 4 thus held within the hysteresis $\Delta U$. The switching on and off of the constant current sources 24 and 25 is synchronized with the reference signal R and therefore delayed on an average by the duration of half a period of the reference signal R; for this reason the frequency of the reference signal R must be sufficiently high relative to that of the polarity signal P. In the pulse diagram, the reference signal R and the output signal F are hatched to indicate the high frequency of the reference signal R.

More specifically, the timing during a period of the polarity signal P is as follows. From time $t_0$ onwards, when the polarity has just been reversed and the negative constant current source 25 switched off and the positive constant current source 24 switched on with a negligible delay, the integrator 4 is charged with the now dominant reference current $I_R^+$. The output voltage $U_A$ drops, until at time $t_1$ the lower threshold value $U_0$ of the threshold switch 9' is reached and the constant current source 24 switched off again. During the period $t_0$ to $t_1$ an uninterrupted set of constant compensating charges is transmitted to the integrator 4 and an equal number of output pulses (the output signal F) is transmitted to the output 28 of the analog to frequency convertor 2. From time $t_1$ onwards the output voltage $U_A$ rises again, because now only the negative measuring current $I_M$ is flowing the integrator 4. The positive constant current source 24 is switched on again at time $t_2$ and switched off again at time $t_3$. The divider stage 29 trips at time $t_3$, thereby preparing the flip-flop 30 to trip. As soon as the output voltage $U_A$ reaches the upper threshold value $U_0$ of the threshold switch 9' at time $t_4$, the flip-flop 30 is tripped immediately, the polarity signal P is changed and the polarity of the measuring current $I_M$ is reversed. The now positive measuring current $I_M$ guides the integrator 4 towards the lower threshold value $U_U$ of the threshold switch 9'. During the periods of time $t_5$ to $t_6$ and $t_7$ to $t_8$ the negative constant current source 25 is switched on, thereby driving the output voltage $U_A$ towards the upper threshold value $U_0$. At time $t_8$ the polarity signal P changes again, so that a new period begins.

The division ratio N' of the divider stage 29 must similarly be linear and equal to two or more. The choice of the division ratio determines the number of sets of compensating charges per switching-over period of the polarity signal P. There is no exact relationship between the frequency of the polarity signal P and that of the output signal F.

Figure 5:
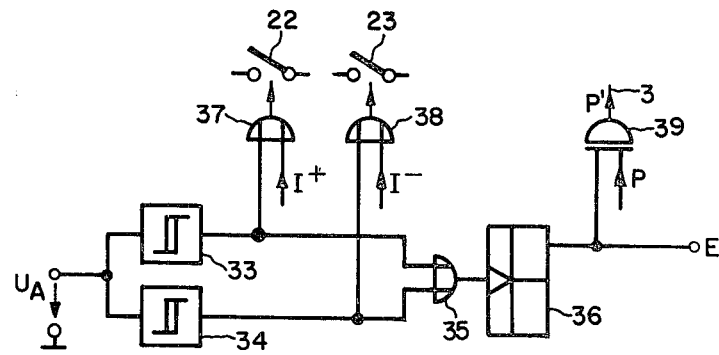
FIG. 5 is a schematic circuit diagram of an auxiliary circuit.

The analog to frequency convertors described with reference to FIG. 1 and with reference to FIGS. 1 and 3 can be modified with simple additional means, to enable them to process both positive and negative measuring currents $I_M$ (that is in the example illustrated, positive and negative values of the product UI). FIG. 5 shows an example of an appropriate auxiliary circuit. Two threshold switches in the form of Schmitt triggers circuits 33 and 34 are coupled at the input side to the integrator 4 (FIG. 1) and at the output side to a trigger stage 36 via an OR-gate 35. The threshold values of the Schmitt trigger circuit 33 are above that of the threshold switch 9 or 9' and the threshold values of the Schmitt trigger circuit 34 below it. The output of the Schmitt trigger circuit 33 or 34 is connected to an input of an OR-gate 37 or 38, which is included in the line which controls switch 22 or 23 and carries signal $I^+$ or $I^-$. The output of the trigger stage 36 is coupled to an EXCLUSIVE-OR-Gate 39 which is included in the control input 3 of the multiplier 1.

If there is a change in the direction of the measuring current $I_M$ not caused by the polarity signal P, the output voltage $U_A$ will rise or drop until one of the Schmitt trigger circuits 33 or 34 responds. The associated constant current source 24 or 25 will thereby be switched on, the capacitor 8 of the integrator 4 will be partially discharged, and the output $U_A$ returned to near the normal working range. When the Schmitt trigger circuit 33 or 34 in question is switched back, the trigger stage 36 will be tripped and the polarity signal P' at the control output 3 and thus the polarity of the measuring current $I_M$ also changed. The signal E at the output of the trigger stage 36 will show the direction of the measuring current $I_M$ independent of the reversal of polarity.

The advantage of the analog to frequency convertor described over known arrangements working by the usual charge compensating process without any reversal of polarity is that fault currents independent of polarity are compensated for, thus giving greater measuring accuracy and a greater dynamic range. Idle running is also prevented automatically. In the last embodiment described, that appropriate for positive and negative measuring currents, complete symmetry is obtained for both directions of the current, even when currents $I_R^+$ and $I_R^-$ of the two constant current sources 24 and 25 are not exactly equal, for example due to ageing.

The advantage of the analog to frequency convertor described over known arrangements operating by the charge changing process is that the measuring constant is given by the charge content of compensation pulses;

the charge content can be kept constant very accurately and with long term stability using simple means. There is also greater dimensioning freedom than with the charge changing process, if a high output frequency is required. Finally, there is the possibility illustrated, of compensating fully for the effect of fault currents independent of polarity.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. An analog to frequency convertor for deriving by a charge quantity compensation process, an output signal proportional in frequency to the magntidue of a current or voltage input to said analog to frequency convertor, comprising:
   integrating means for receiving said input to the analog to frequency convertor to supply an output dependent thereon, said integrating means including a capacitor;
   threshold circuit means coupled to said capacitor, for responding when the voltage across said capacitor reaches at least one predetermined level;
   compensating charge transmitter means having its output coupled to said capacitor for supplying a constant increment of charge to said capacitor each time said threshold circuit means responds;
   control circuit means coupled to said threshold circuit means for developing a periodic digital polarity signal, the logic value of which polarity signal controls both the polarity of said input to the analog to frequency convertor and the polarity of said increment of charge supplied to said capacitor, said logic value always changing at a predetermined level of said voltage across said capacitor; and
   means to derive said output signal dependent upon the frequency with which said increments of charge are supplied to said capacitor.

2. An analog to frequency convertor according to claim 1, wherein said threshold circuit means forms a part of said control circuit means, and wherein selected output signal changes of said threshold circuit means produce a change in said logic value of said polarity signal.

3. An analog to frequency convertor according to claim 1, further comprising divider circuit means having a division ratio of N, where N is an even number equal to 2 or more, and in which said output signal is supplied to said divider circuit means to develop a frequency-divided reference signal which controls the frequency of said polarity signal.

4. An analog to frequency convertor according to claim 1, further comprising reference oscillator means for developing a reference signal to control the frequency of said polarity signal.

5. An analog to frequency convertor according to claim 1, further comprising divider circuit means having a division ratio of N, where N is an even number equal to 2 or more, and in which the output from said threshold circuit means is supplied to said divider circuit means to develop a frequency-divided reference signal which controls the frequency of said polarity signal.

6. An analog to frequency convertor according to claim 1, in which said control circuit means comprises a trigger stage having two inputs and an output, the truth table of said trigger stage being:

| K | Z | P |
|---|---|---|
| 0 | 0 | X |
| 0 | 1 | 1 |
| 1 | 0 | 0 |
| 1 | 1 | X | where:
   $K$ is the signal at said first input of said trigger stage,
   $Z$ is the signal at said second input of said trigger stage, $P$ is the polarity signal at said output of said trigger stage, and $X$ is the previous state;
   wherein said first input of said trigger stage is coupled to said threshold circuit means; wherein
   said second input of said trigger stage is supplied with a reference frequency signal; and wherein
   said threshold circuit means is a voltage comparator which respond at only one threshold voltage level.

7. An analog to frequency convertor according to claim 1, in which said control circuit means includes a divider circuit means and a D flip-flop having a clock pulse input and a D-input, and in which said threshold circuit means is a Schmitt trigger circuit which responds at both an upper and a lower threshold voltage level, the output of said Schimitt trigger circuit being coupled to the input of said divider circuit means and to said clock pulse input of said flip-flop, and the output of said divider circuit means being coupled to said D-input of said flip-flop.

8. An analog to frequency convertor according to claim 6, further comprising a first AND-gate having three inputs and an output, and a second AND-gate having three inverting inputs and an output, said first and second inputs and said output of said trigger stage being respectively coupled both to said three inputs of said first AND-gate and to said three inverting inputs of said second AND-gate, said outputs of said first and second AND-gates being coupled to said compensating charge transmitter means, wherein the supplying of a signal over said output of said first AND-gate to said compensating charge transmitter means causes transmission of a said increment of charge of one polarity to said capacitor, and wherein the supplying of a signal over said output of said second AND-gate to said compensating charge transmitter means causes transmission of a said increment of charge of the opposite polarity to said capacitor.

9. An analog to frequency convertor according to claim 7, further comprising a first AND-gate having two inputs and an output, and a second AND-gate having two inverting inputs and an output, said output of said Schmitt trigger circuit and said output of said divider circuit means being respectively coupled to said two inputs of said first AND-gate, and said output of said Schmitt trigger circuit and the output of said flip-flop being respectively coupled to said two inverting inputs of said second AND-gate, said outputs of said first and second AND-gates being coupled to said compensating charge transmitter means, wherein the supplying of a signal over said output of said first AND-gate to said compensating charge transmitter means causes transmission of a said increment of charge of one polarity to said capacitor, and wherein the supplying of a signal over said output of said second AND-gate to said compensating charge transmitter means causes transmission of a said increment of charge of the opposite polarity to said capacitor.

10. An analog to frequency convertor according to claim 1, in which said compensating charge transmitter means comprises first and second constant current sources of positive and negative polarity respectively, a reference oscillator, and switch means controlled by said control circuit means selectively to couple one of said sources to said capacitor for a period determined by said oscillator.

11. An analog to frequency convertor according to claim 1, comprising first and second threshold circuit means coupled to said capacitor to derive a proportional output frequency both when said input to the analog to frequency convertor is positive and when it is negative, and further comprising an OR-gate having two inputs and an output, a trigger stage and and EXCLUSIVE-OR-gate, and in which said compensating charge transmitter means comprises first and second constant current sources of positive and negative polarity respectively, the outputs of said threshold circuit means being respectively coupled to said inputs of said OR-gate, the output of which is coupled via said trigger stage to said EXCLUSIVE-OR-gate to control said polarity signal, the output signal from said trigger stage also being dependent on the polarity of said input to the analog to frequency convertor, and the output signals from said two threshold circuits respectively controlling said sources to supply said increments of charge of the respective polarity to said capacitor.

12. An analog to frequency convertor for deriving by a charge quantity compensation process, an output signal proportional in frequency to the magntidue of a current or voltage input to said analog to frequency convertor, comprising:

integrating means for receiving said input to the analog to frequency convertor to supply an output dependent thereon, said integrating means including a capacitor;

threshold circuit means coupled to said capacitor, for responding when the voltage across said capacitor reaches at least one predetermined level;

compensating charge transmitter means having its output coupled to said capacitor for supplying a constant increment of charge to said capacitor each time said threshold circuit means responds;

control circuit means coupled to said threshold circuit means for developing a periodic digital polarity signal, the logic value of which polarity signal controls both the polarity of said input to the analog to frequency convertor and the polarity of said increment of charge supplied to said capacitor; and means to derive said output signal dependent upon the frequency with which said increments of charge are supplied to said capacitor.

* * * * *

UNITED STATES PATENT OFFICE
CERTIFICATE OF CORRECTION

Patent No. 4,124,821  Dated November 7, 1978

Inventor(s) Jan Petr

It is certified that error appears in the above-identified patent and that said Letters Patent are hereby corrected as shown below:

Column 3, line 67, second occurrence of "and" should read --one--.

Column 5, line 63, insert --to-- after "flowing".

Column 9, line 19, third occurrence of "and" should read --an--.

Signed and Sealed this

First Day of April 1980

[SEAL]

Attest:

SIDNEY A. DIAMOND

Attesting Officer   Commissioner of Patents and Trademarks